United States Patent [19]
Arnoux et al.

[11] Patent Number: 4,557,383
[45] Date of Patent: Dec. 10, 1985

[54] SHOCK PROOF CASE

[75] Inventors: Daniel Arnoux; Maurice Haye; Daniel Bonneau, all of Paris, France

[73] Assignee: Construction D'Appereillage, Paris, France

[21] Appl. No.: 675,936

[22] Filed: Nov. 28, 1984

[30] Foreign Application Priority Data

Nov. 30, 1983 [FR] France ............................ 83 19094

[51] Int. Cl.⁴ .............................................. B65D 81/02
[52] U.S. Cl. .................... 206/521; 220/82 A; 220/82 R; 206/328
[58] Field of Search .................... 220/82 R, 82 A; 206/521, 328, 586, 591

[56] References Cited
U.S. PATENT DOCUMENTS 2,961,108  11/1960  Johnson ........................... 220/82 A
3,972,239   8/1976  Duster et al. ..................... 220/82 A
4,112,283   9/1978  Lathrop ........................... 220/82 A
4,245,749   1/1981  Graves ............................ 220/82 A Primary Examiner—Joseph Man-Fu Moy
Attorney, Agent, or Firm—Wolf, Greenfield & Sacks

[57] ABSTRACT

A shock-proof case especially suited for portable measurement apparatus. The case is comprised of a moldable elastomeric material having a wall with an opening therein, in the periphery of which is formed an elastic encasement groove for receipt of a plate of a material significantly more rigid than said elastomeric material. The plate includes numerous cavities in its peripheral region encased within the groove. The elastomeric material of the case is remolded over the peripheral region of the plate in such a way that the elastomeric material fills the cavities in the plate during the molding process, and thus ensures an effective bonding between the plate and the elastomeric material of the case. The case may also be provided with damping means of varying thickness to cushion the apparatus against shock.

8 Claims, 9 Drawing Figures

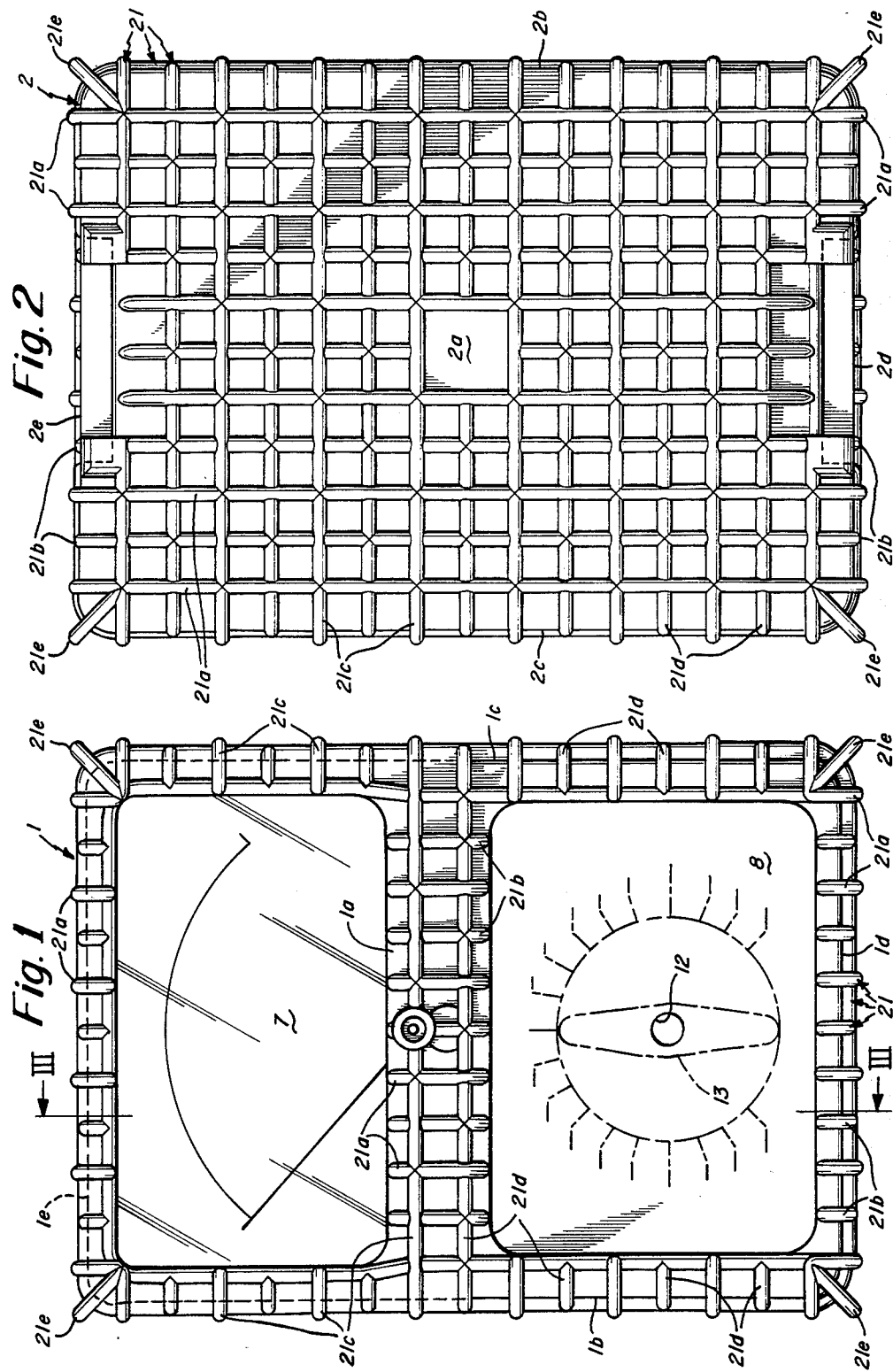

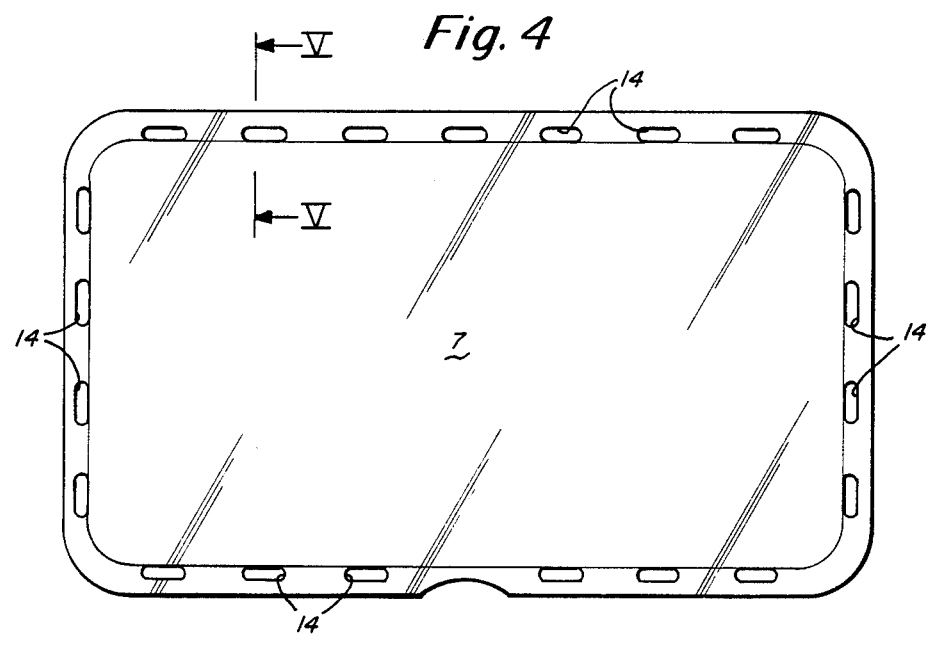
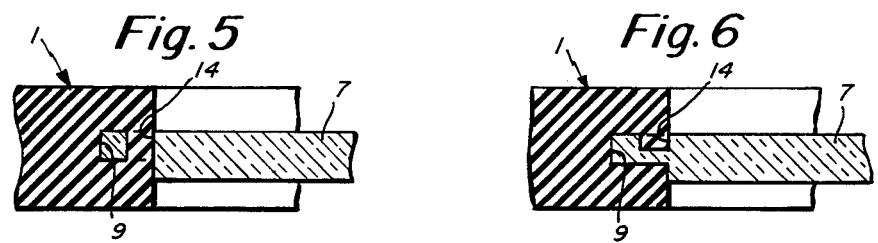
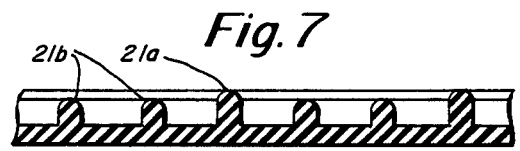
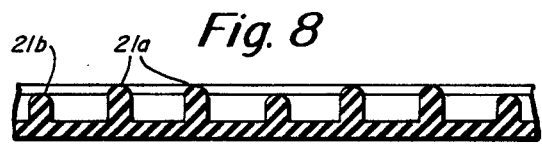

SHOCK PROOF CASE

The present invention concerns a shock-proof case, especially for portable measurement apparatus, of a type consisting of two sections which can be assembled together. The sections are made of a moldable elastomeric material, one of the two sections including a main wall having an opening, in the periphery of which is formed an elastic encasement groove. A plate of a material significantly more rigid than said elastomeric material is embedded in said groove.

A shock-proof case of this type is already known through French Patent No. 2,188,908. Numerous difficulties have been encountered in the realization of this case. A first difficulty resides in obtaining a sufficient bond between the portions of the case made of elastomeric material, on the one hand, and the rigid or semi-rigid portions contained within, on the other hand. This is especially true with regard to the protective glass of the indicator dial of the measurement instrument. In fact, with the previously known case, it has been observed that upon the occurrence of a particularly severe shock, such as a fall on the ground, the protective glass has a tendency to become unseated from the above-mentioned groove, and even to come out of the groove completely. A second difficulty resides in positioning and connecting to the case the interior board bearing the components of the measurement apparatus (electrical and electronic components, measurement indicator—galvanometer or numerical display). A third difficulty resides in obtaining a casing whose walls present an elasticity that is variable as a function of thickness. To this effect, French Patent No. 2,188,908 envisions elastic elements in relief on the faces of the case, with these elastic elements being hollowed out from the outside or from within, with the cavities thus obtained being eventually obstructed, in order to obtain a multitude of sealed volumes filled with air and perfectly elastic. Another solution proposed by French Patent No. 2,188,908 consists in utilizing a plastic or elastomeric material which itself has a variable elasticity in its thickness, so as to have a relatively high hardness and lower elasticity on the interior surface, and a relatively low hardness and a greater elasticity on the exterior surface. These two solutions have shown themselves to be difficult to realize in practice.

The principal object of the present invention is to improve the bond between the above-mentioned rigid or semi-rigid plate and the portion of the case of elastomeric material.

The present invention also has as its object to provide a certain number of construction arrangements facilitating the realization of a shock-proof case, while simultaneously improving its hardiness.

To this effect, the shock-proof case according to the present invention is characterized in that the aforementioned plate bears numerous cavities in its peripheral region encased within the groove, and in that the portion of the case comprising the opening is realized by remolding over the plate, so that the elastomeric material fills the cavities of the plate during molding.

In this manner an efficacious bonding is obtained between the plate and the portion of the case of elastomeric material.

Other characteristics and advantages of the present invention will be revealed in the course of the following description of one embodiment of a shock-proof case.

BRIEF DESCRIPTION OF THE DRAWINGS

FIGS. 1 and 2 are views respectively from above and below the shock-proof case for a measurement apparatus.

FIG. 4 is a view from above of the protective glass of the indicator dial of the case of FIG. 1.

FIG. 5 is a partial cutaway view along the line V—V of FIG. 4, showing on an enlarged scale the detail of the bond between the protective glass and the portion of the case of elastomeric material.

FIG. 6 is a view similar to FIG. 5, showing a variation.

FIGS. 7 to 9 are partial cutaway views, showing other possible configurations for the elastic elements in relief of the case.

DETAILED DESCRIPTION OF THE INVENTION

Figure 3:
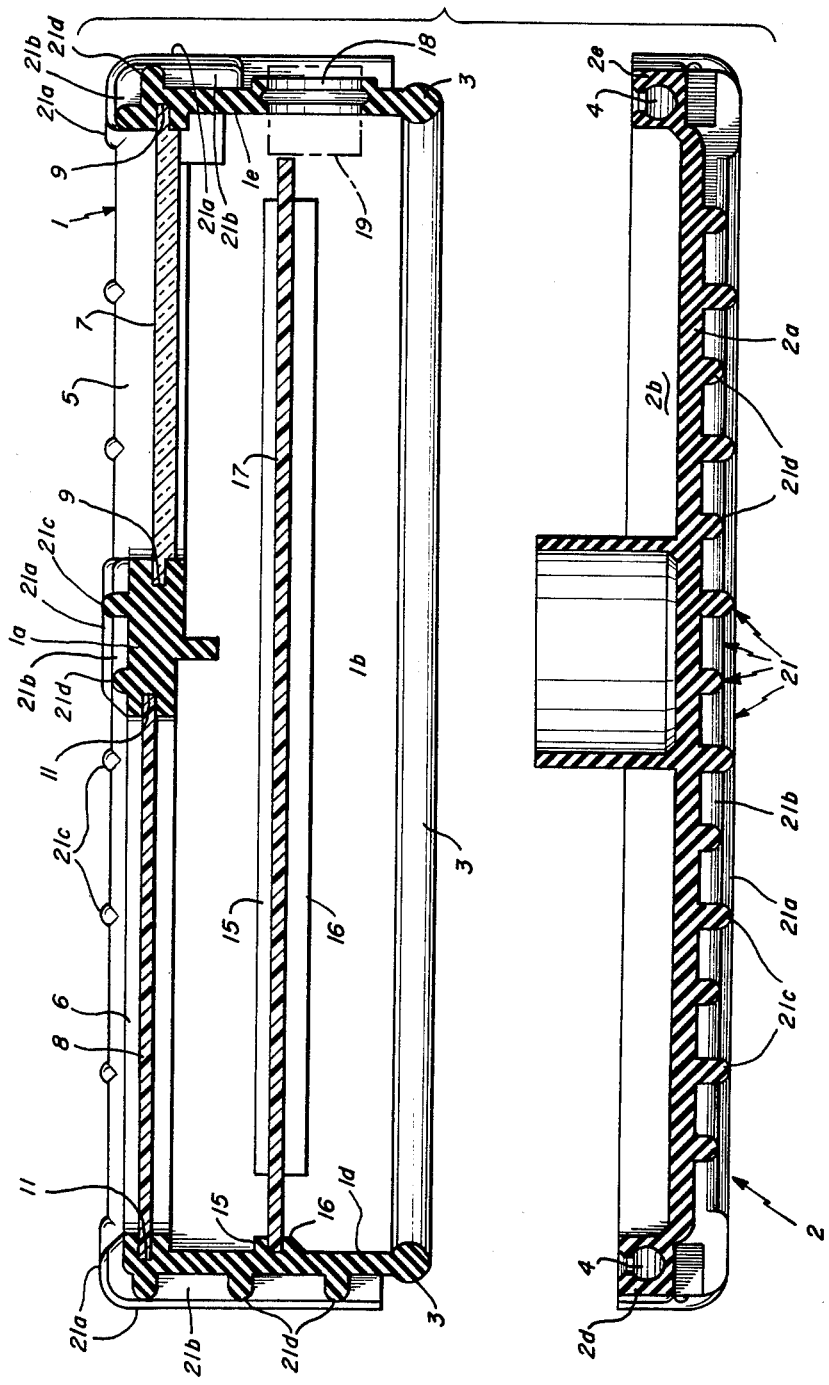
FIG. 3 is a cutaway view along the line III—III of FIG. 1, showing on an enlarged scale the two portions of the case detached from one another.

The case represented in FIGS. 1 to 3 comprises an upper portion 1 and lower portion 2 of a moldable elastomeric material. The parts 1 and 2 can be assembled together, in a detachable manner, by an elastic catch mechanism, by means of a flange 3 and a groove 4 whose transverse cross sections have complementary form. As shown in FIG. 3, the flange 3 and groove 4, viewed in cross section, can have a bulbous form. Although in FIG. 3 the flange 3 is represented as connected to the upper part 1, and the groove 4 as formed in the lower part 2, the reverse configuration is of course possible.

In its upper wall 1a, the upper part 1 includes two large rectangular openings 5 and 6 (FIG. 3). Two plates 7 and 8 are encased respectively in grooves 9 and 11, in the form of deep slots provided in the periphery of each of the openings 5 and 6. The plate 7 is a protective plate of safety glass or an unbreakable transparent plastic material. The plate 8 is of metal or a semi-rigid plastic material. As shown in FIG. 1, the plate 8 includes at least one hole 12 for passage of a rotary function and/or range selector switch (only the knob 13 of the rotary switch has been represented in FIG. 1, in dashed lines), and on its upper surface the plate 8 bears indications relating to the functions and/or ranges of the measurement instrument.

In order to prevent the plates 7 and 8 from coming out of their respective grooves 9 and 11 in the event of a severe shock or jolt, each of the two plates 7 and 8 includes numerous cavities 14 as shown in FIG. 4 for the plate 7. The cavities 14 have, for example, a rectangular cross section. While the cavities 14 may preferably be constituted by through-holes as shown in FIG. 5, they may also be constituted by deep blind holes as shown in FIG. 6. The upper part 1 of the case is realized by remolding over the plates 7 and 8, in such a way that the elastomeric material fills the cavities 14 of the plates 7 and 8 during the remolding, and thus ensures a practically undetachable bond between each of the plates 7 and 8 and the elastomeric material constituting the upper part 12 of the case. For molding, an injection molding technique can be used. The elastomeric material utilized can be a thermoplastic elastomer, as for example, a copolymer of styrene-butadiene-styrene (SBS) having a Shore hardness between 60 and 70. Good results have been obtained with an elastomeric material sold by the F. Chevassus company under the commercial designation "Fervanflex CT 1 060 or 1 070."

At least two opposite lateral walls 1b and 1c, and preferably the three lateral walls 1b, 1c and 1d (FIG. 1) of the upper part 1 of the case include on their interior surface two flanges 15 and 16 (FIG. 3), which are parallel to one another and to the upper wall 1a, and form between them an elastic groove in which is encased a printed circuit board 17. As shown in FIG. 3, the lower flange 16 has a roughly triangular cross section, to facilitate insertion of the edges of the board 17 into the groove formed between the two flanges 15 and 16. The fourth lateral wall 1e of the upper part 1 includes a number of holes 18 (only one hole is visible in FIG. 3), forming passages for sockets or terminals 19 connected electrically to the printed circuits of the board 17, for connection of the measuring apparatus to exterior circuits. In addition to printed circuits, the board 17 bears the rotary switch mentioned above, the various electrical and electronic components of the measurement circuits, and the measurement indicator (galvanometer or numerical display), this last being placed below the transparent plate 7.

Each of the walls 1a to 1e and 2a to 2e of the upper and lower case sections 1 and 2 has on its exterior face a set of elements in relief 21, of elastomeric material, forming shock dampers. The elements in relief 21 on a single exterior face have different heights with respect to the exterior face. As shown in FIGS. 1 to 3, the elements in relief 21 can include a first group of ribs 21a and 21b, parallel to one another and alternately high and low, and a second group of ribs 21c and 21d, alternately high and low, and parallel to one another, intersecting at right angles with the ribs 21a and 21b of the first group. Thus, upon the occurrence of a shock—for example, if the instrument falls on the grounds—the shock is first damped by the ribs 21a and 21c projecting furthest outward, and then the less prominent ribs 21b and 21d between them come into action as well to damp the shock after the more prominent ribs have been compressed or crushed by an amount equal to the difference in height of the ribs. Thus there is obtained in a simple and easily realizable manner a variable elasticity as a function of thickness. As shown in FIGS. 1 and 2, ribs 21e, oriented at 45° to the ribs 21a and 21c, are also provided at the four corners of the case.

While in FIGS. 1 to 3, the ribs 21a and 21b or 21c and 21d may be represented as alternately high and low, it is possible to provide a different distribution for the high and low ribs according to the degree of elasticity desired. For example, it is possible to provide two low ribs 21b (and/or 21d) for one high rib 21a (and/or 21c), as shown in FIG. 7, or, inversely, two high ribs 21a (and/or 21c) for one low rib 21b (and/or 21d), as shown in FIG. 8. In order to obtain an elasticity varying in a more progressive manner with thickness, it is possible to provide ribs 21 having heights such that the peaks of adjacent ribs fall on a curve or sinusoid 22, as shown in FIG. 9.

It is to understood that the embodiment of the case which has been described above is given solely by way of example and in no way constitutes an exclusive example. Numerous modifications may easily be made by those skilled in the art without departing from the scope of the present invention. Thus in particular, the cavities 14 provided in the periphery of each of the two plates 7 and 8, instead of being constituted by holes, can consist of T-slots or dovetails formed in the edges of the plates 7 and 8. Moreover, instead of being realized in the form of ribs, the elements in relief 21 may be realized in the form of cylindrical or truncated conical studs of different heights. Furthermore, the lateral walls 1b to 1e of the upper case section 1 may be lower, and the lateral walls 2b to 2e of the lower section 2 higher than those shown in FIG. 3. In that embodiment, the flanges 15 and 16 may be formed in the interior faces of the lateral walls 2a to 2d of the lower section 2.

We claim:

1. A shockproof case comprising
    a housing of moldable elastomeric material having a wall with an opening therein, at the periphery of which is formed an encasement groove; and
    a plate of a material more rigid than said elastomeric material, which plate is encased at its peripheral region within said groove, said plate having a plurality of cavities formed in said peripheral region;
    wherein said cavities are filled with said elastomeric material forming said case by means of a molding process to secure said plate within said groove.

2. The case of claim 1, wherein said cavities are through holes.

3. The case of claim 1, wherein said cavities are blind holes.

4. The case of claim 1, wherein each wall of the housing bears on its exterior face, elastomeric damping means, said means being comprised of a plurality of structures formed on said face and having differing heights with respect to said face.

5. The case of claim 4, wherein said structures comprise a first group of ribs parallel to one another, and a second group of ribs parallel to one another and intersecting said ribs of the first group at substantially right angles.

6. The case of claim 5, wherein the ribs of the first group and of the second group are alternatively relatively high and low.

7. The case of claim 1, wherein at least two opposite lateral walls of the housing include on their interior faces two flanges that are parallel to each other and to the wall having said opening therein, and which between them form a groove for encasement of a printed circuit board.

8. The case of claim 7, wherein one of the two flanges has a roughly triangular cross-section.

* * * * *